United States Patent [19]

Tagiri

[11] Patent Number: 5,303,278
[45] Date of Patent: Apr. 12, 1994

[54] CIRCUIT FOR COMPENSATING WAVEFORM SHAPING ERROR

[75] Inventor: Hirokazu Tagiri, Kyoto, Japan
[73] Assignee: Rohm Co., Ltd., Kyoto, Japan
[21] Appl. No.: 921,246
[22] Filed: Jul. 29, 1992

[30] Foreign Application Priority Data

Aug. 9, 1991 [JP] Japan ................... 3-200791

[51] Int. Cl.⁵ .................... H03K 5/00; G06M 3/00
[52] U.S. Cl. ........................... 377/20; 377/56; 307/268
[58] Field of Search .............. 377/20, 56; 307/268

[56] References Cited

U.S. PATENT DOCUMENTS

| | | | |
|---|---|---|---|
| 4,352,158 | 9/1982 | Date et al. | 364/431.05 |
| 4,361,857 | 11/1982 | Sakamoto | 360/77.17 |
| 4,445,146 | 4/1984 | Sakamoto et al. | 360/10.3 |
| 5,057,784 | 10/1991 | Park | 377/20 |
| 5,140,256 | 8/1992 | Hara | 377/20 |

Primary Examiner—John S. Heyman
Attorney, Agent, or Firm—Oliff & Berridge

[57] ABSTRACT

In a capstan servo circuit, a waveform shaping error which might occur while shaping the waveform of an FG signal is suppressed to control the speed of a capstan motor stably. An FG signal from a frequency generator mounted on the shaft of the capstan motor is shaped in waveform by an amplifier and a comparator and is multiplied to double its frequency by a multiplier. The multiplied FG signal is inputted to an FV counter where the time from a rise to a subsequent fall of the waveform-shaped FG signal and the time from a fall to a subsequent rise of the same FG signal are counted. The count values are latched in order by two levels of latch circuits. The N-bit count values latched are inputted to an adder where a mean of the two count values is calculated by outputting the upper N bits and is supplied to the capstan motor as a servo signal.

2 Claims, 2 Drawing Sheets

CIRCUIT FOR COMPENSATING WAVEFORM SHAPING ERROR

BACKGROUND OF THE INVENTION

1. Field of the Invention

This invention relates to a circuit for compensating for waveform shaping errors, and more particularly to such a compensating circuit for controlling the speed of a capstan motor by using an FG signal.

2. Description of the Related Art

A capstan servo circuit is currently known which controls the speed of a capstan motor such as that of a VTR. In the servo circuit, a frequency generator mounted on the shaft of the capstan motor outputs an FG signal according to the r.p.m. of the motor. This FG signal is wave shaped and is multiplied for use as a servo signal.

FIG. 1 of the accompanying drawings is a block diagram showing such a conventional capstan servo circuit. An FG signal from a frequency generator mounted on the shaft of a non-illustrated capstan motor is inputted to an amplifier 10 and is amplified thereby. The amplified FG signal is inputted to the inverting input terminal of a comparator 12a and the inverting input terminal of a comparator 12b and is compared with their respective predetermined reference levels. The output of the comparator 12a is inputted to the set terminal S of an RS flip-flop 14, while the output of the comparator 12b is inputted to the reset terminal R of the RS flip-flop 14. As a result, the output of the RS flip-flop 14 will be a rectangular signal having a pulse width exceeding the predetermined reference levels of the comparators 12a, 12b. The amplifier 10, the comparators 12a, 12b and the RS flip-flop 14 constitute a waveform shaping unit 1.

The FG signal shaped into a rectangular waveform is multiplied to a double frequency by a frequency multiplier 16. An FV counter 18 counts first the time t1 from a rise to a subsequent fall of the waveform-shaped FG signal and then the time t2 from a fall to a subsequent rise of the waveform-shaped FG signal. A pulse width modulator 20 modulates a pulse width of the resulting FG signal by the count values and outputs the modulated signal as a servo signal for the capstan motor.

In this conventional capstan servo circuit, waveform shaping errors are reduced by increasing the gain of the amplifier 10, and any increase of the waveform shaping errors is prevented by narrowing the comparison levels of the comparators 12a, 12b.

However, with this arrangement, waveform shaping errors would depend on the varying characteristics such as offset or distortion factor of the amplifier and comparators so that uniform characteristics are difficult to achieve.

SUMMARY OF THE INVENTION

It is therefore an object of this invention to provide a waveform shaping error compensating circuit which is able to supply a signal not susceptible to influences from waveform shaping errors that might occur in the output of an amplifier or the outputs of comparators.

According to the invention, there is provided a waveform shaping error compensator circuit comprising: a waveform shaper for waveform-shaping by converting an input signal to a rectangular signal; a multiplier for multiplying the waveform-shaped signal; and a counter for counting a time t1 from a rise to a subsequent fall of the multiplied signal and a time t2 from a fall to a subsequent rise of the multiplied signal; two levels of latch circuits for latching the times t1 and t2 counted by the counter; and an adder for adding up the times t1 and t2 latched by the two levels of latch circuits and for outputting a mean value of the times t1 and t2.

In the waveform shaping error compensating circuit of this invention, the two levels of latch circuits latch in order the count values of the counter, and the adder adds up the latched count values to calculate a mean of the two count values.

Thus, using the mean of the two count values one after another rather than using the mere count values of the counter, the waveform shaping errors contained in the individual count values are canceled to obtain a servo signal.

DETAILED DESCRIPTION

A capstan servo circuit embodying a waveform shaping error compensating circuit of this invention will now be described with reference to the accompanying drawings.

Figure 1:
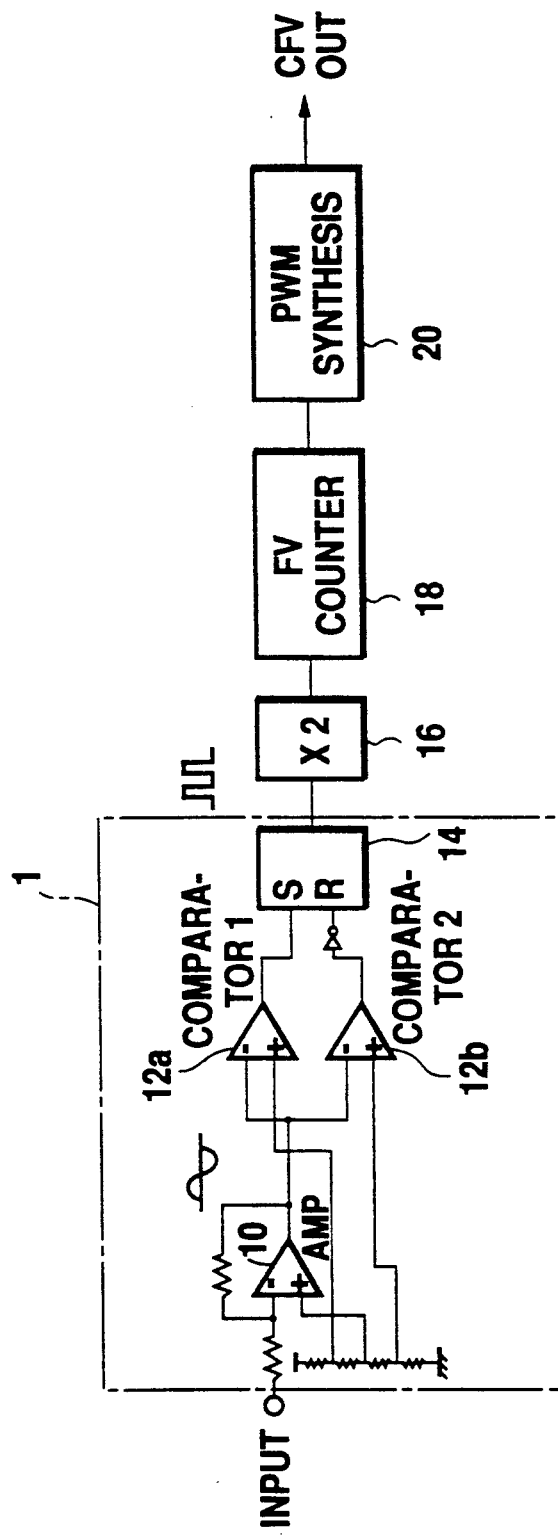
FIG. 1 is a block diagram of a conventional capstan servo circuit.

FIG. 1 is a block diagram showing a main portion of the capstan servo circuit. In the capstan servo circuit, an FG signal inputted to a waveform shaper 1 is outputted to a frequency multiplier 16. Specifically, an FG signal which corresponds to the r.p.m. of a capstan motor and which is outputted from a frequency generator mounted on the shaft of the capstan motor is inputted to an amplifier 10. The FG signal amplified by the amplifier 10 is inputted to the inverting input terminals of two comparators 12a, 12b. Meanwhile, predetermined reference signals are inputted to the non-inverting input terminal of these two comparators 12a, 12b so that the FG signal is compared with the reference levels. The result of comparison is inputted to the set terminal S and the reset terminal R of an RS flip-flop 14, and then the waveform-shaped FG signal having a pulse width exceeding the time between reference levels is outputted. The waveform-shaped FG signal is further inputted to the frequency multiplier 16 where it is multiplied so as to have a double frequency. Then an FV counter 18 counts the time t1 from a rise to a subsequent fall of the waveform-shaped pulse and the time t2 from a fall to a subsequent rise of the waveform-shaped pulse.

In the conventional art, a servo signal is obtained by modulating in pulse width, based on the count value of the FV counter 18. Whereas in this embodiment, as shown in FIG. 1, the count values of the FV counter 18 are latched in order by two levels of latch circuits 22, 24, and the count values latched by these latch circuits 22, 24 are added up by an adder 26, whereby a mean of the two count values t1 and t2 is calculated.

The actions of the FV counter 18, the latch circuits 22, 24 and the adder 26 will now be described in detail.

The FG signal multiplied by the frequency multiplier 16 is inputted to the FV counter 18, as described above. Meanwhile, a clock signal CLOCK having a predetermined reference frequency is inputted to the FV counter 18. The FV counter 18 is preset to a predetermined value by the inputted FG signal and performs counting by the clock signal CLOCK until the next FG signal is inputted. The count value counted by the clock signal CLOCK is preset by the next FG signal and is outputted to the latch circuit 22 connected to the FV counter 18. In this embodiment, counting of the count value is done in N bits, and the FV counter 18 performs counting by the clock signal CLOCK until the next FG signal is inputted. When the FG signal is inputted, the FV counter 18 is preset again and sends the count value to the latch circuit 22.

In the latch circuit 22, an input FG signal is inputted as a latch pulse, and the latched count value is sent to the latch circuit 24 of the next level. A current count value from the FV counter 18 is latched by the latch circuit 22, and the previous count value is latched by the latch circuit 24. Now assume that the current count value latched by the latch circuit 22 is t1 and the previous count value latched by the latch circuit 24 is t2.

Figure 2:
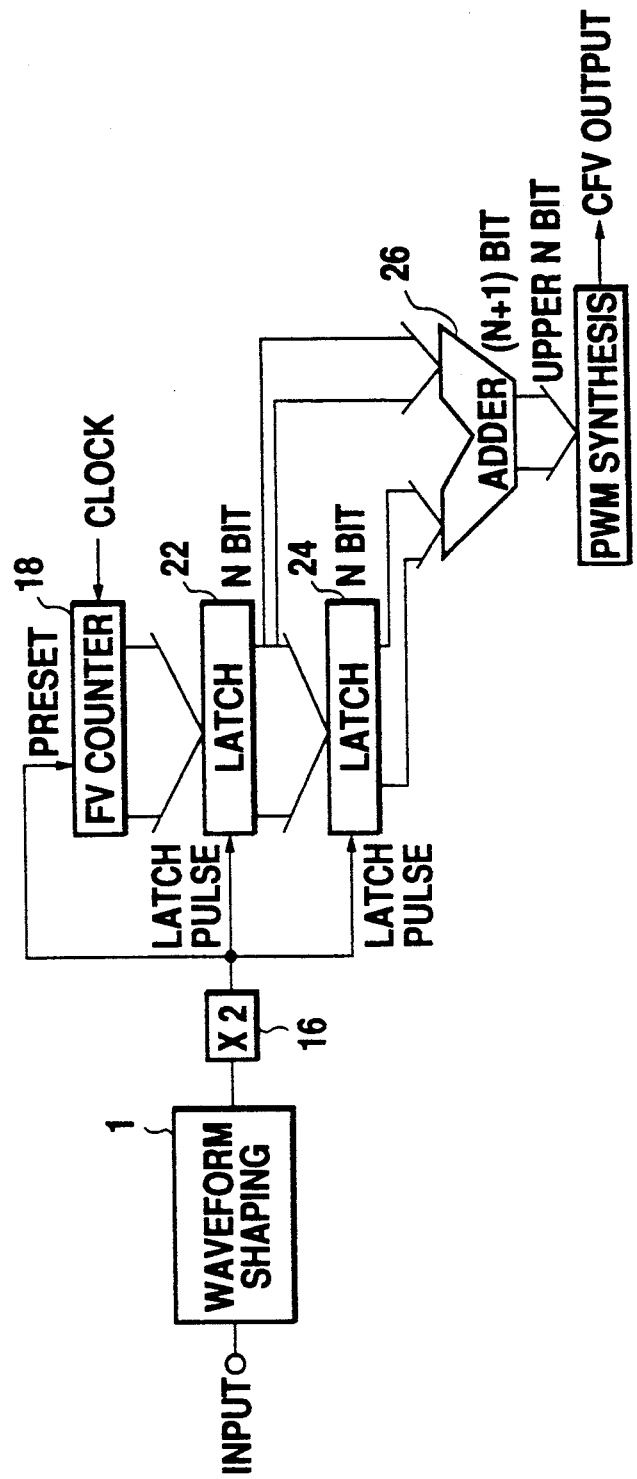
FIG. 2 is a block diagram of a main portion of a capstan servo circuit according to this invention.

The output terminals of the latch circuits 22 24 are connected to the adder 26 so that the count values latched by the respective latch circuits are inputted to the adder 26. The adder 26 has (N+1) bits and outputs the upper N bits to the pulse-width modulator 20 shown in FIG. 2. Thus the N-bit count values are added up and the upper N bits are outputted so that a mean (t1+t2)/2 of the count values t1 and t2 latched by the latch circuits 22, 24 is outputted. As a result, waveform shaping errors contained in t1 and t2 are canceled by the averaging. The count value (t1+t2)/2 is supplied to the pulse-width modulator 20 and is thereby modulated in pulse width, whereby wows of the capstan motor can be reduced and so it is possible to accurately control the speed of the capstan motor.

In the illustrated embodiment, waveform shaping is done by amplifying the FG signal and then comparing the amplified FG signal with the reference levels by the two comparators 12a, 12b. Whereas in this invention, since the count values are averaged by using the two levels of latch circuits, it is possible to obtain a servo signal even when the FG signal is inputted to a single comparator and is compared with a single reference level for waveform shaping, thus simplifying the circuit construction.

As described above, according to the waveform shaping error compensating circuit of this invention, since a servo signal which is free of any error during waveform shaping can be obtained, it is possible to eliminate wows of the capstan motor and hence to control the speed of the capstan motor stably.

What is claimed is:

1. A waveform shaping error compensator circuit comprising:
   (a) a waveform shaper for performing waveform shaping by converting an input signal to a rectangular signal;
   (b) a multiplier connected to said waveform shaper for multiplying the waveform-shaped signal;
   (c) a counter connected to said multiplier for counting a time t1 from a rise to a subsequent fall of the multiplied signal and a time t2 from a fall and a subsequent rise of the multiplied signal;
   (d) two levels of latch circuits connected to said counter and said multiplier for latching the times t1 and t2 counted by said counter; and
   (e) an adder for adding up the times t1 and t2 latched by said two levels of latch circuits and for outputting a means value of the times t1 and t2.

2. A waveform shaping error compensator circuit according to claim 1, wherein said counter is an N-bit counter, and said adder is an (N+1)-bit adder for adding up the times t1 and t2 and for outputting the upper N bits of (N+1) bits as a means value.

* * * * *